(12) United States Patent
Sugizaki et al.

(10) Patent No.: US 8,378,377 B2
(45) Date of Patent: Feb. 19, 2013

(54) LIGHT EMITTING DEVICE

(75) Inventors: Yoshiaki Sugizaki, Kanagawa-ken (JP); Hideki Shibata, Kanagawa-ken (JP); Akihiro Kojima, Kanagawa-ken (JP); Masayuki Ishikawa, Kanagawa-ken (JP); Hideo Tamura, Kanagawa-ken (JP); Tetsuro Komatsu, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 325 days.

(21) Appl. No.: 12/885,721

(22) Filed: Sep. 20, 2010

(65) Prior Publication Data

US 2011/0291149 A1    Dec. 1, 2011

(30) Foreign Application Priority Data

May 26, 2010 (JP) .................................. 2010-120260

(51) Int. Cl.
*H01L 33/00* (2010.01)

(52) U.S. Cl. ..................... 257/99; 257/79; 257/E33.057

(58) Field of Classification Search .............. 257/79–99, 257/184, 431, E33.057
See application file for complete search history.

(56) References Cited

U.S. PATENT DOCUMENTS

| 2007/0284755 A1* | 12/2007 | Nomoto et al. ................ 257/774 |
| 2010/0051972 A1* | 3/2010 | Chen et al. ....................... 257/88 |
| 2010/0148198 A1 | 6/2010 | Sugizaki et al. |

* cited by examiner

*Primary Examiner* — Chuong A Luu
*Assistant Examiner* — Nga Doan
(74) *Attorney, Agent, or Firm* — Turocy & Watson, LLP

(57) ABSTRACT

According to one embodiment, a light emitting device includes a light emitting chip, an external terminal made of a metal material, and a circuit board. The light emitting chip is mounted on the circuit board via the external terminal. The light emitting chip includes a semiconductor layer, a first electrode, a second electrode, an insulating layer, a first interconnection layer, a second interconnection layer, a first metal pillar, a second metal pillar and a resin layer. The circuit board includes an interconnection bonded to the first metal pillar and the second metal pillar via the external terminal, and a heat radiation material provided on an opposite side of the interconnection and connected to the interconnection.

16 Claims, 16 Drawing Sheets

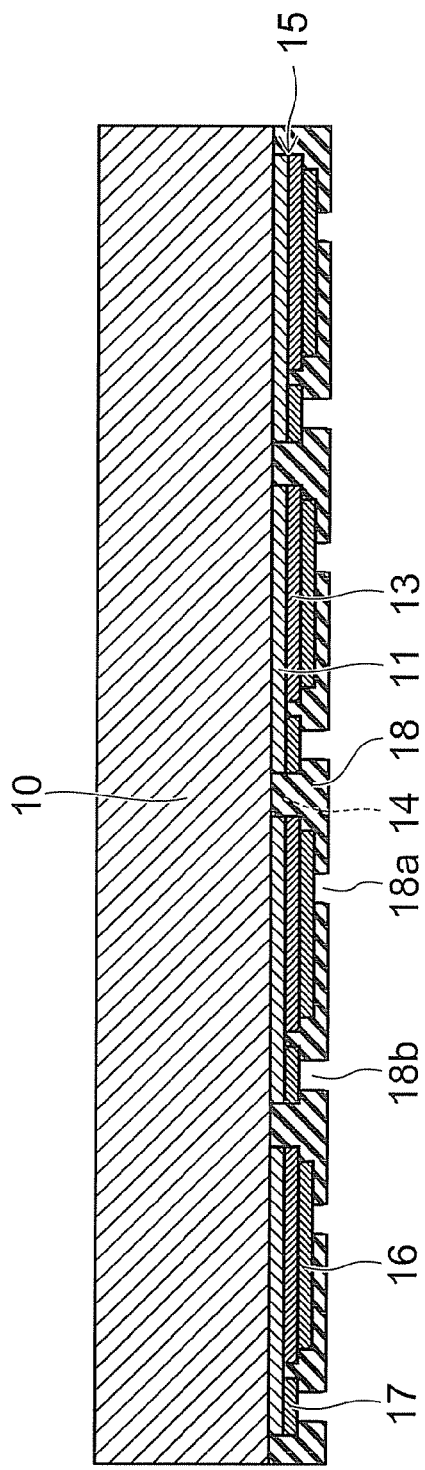
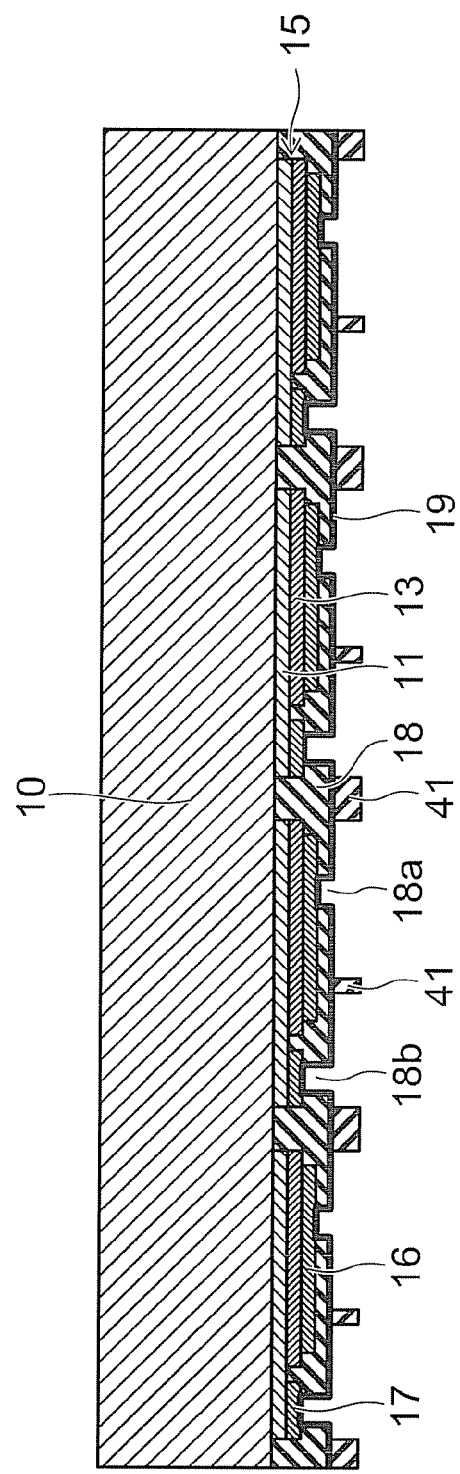
FIG. 3A
FIG. 3B

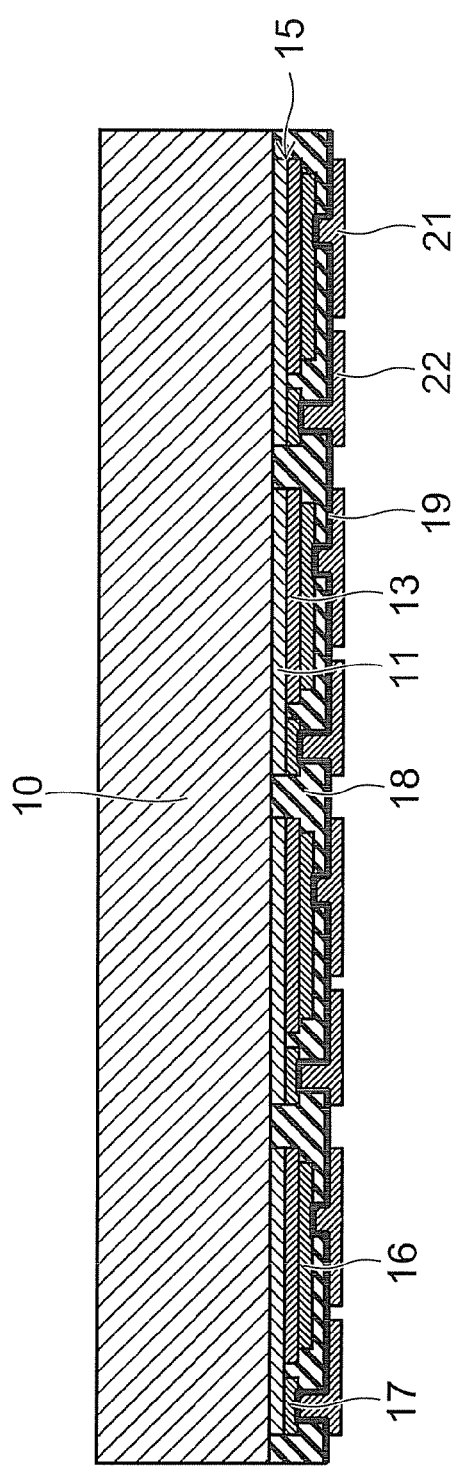
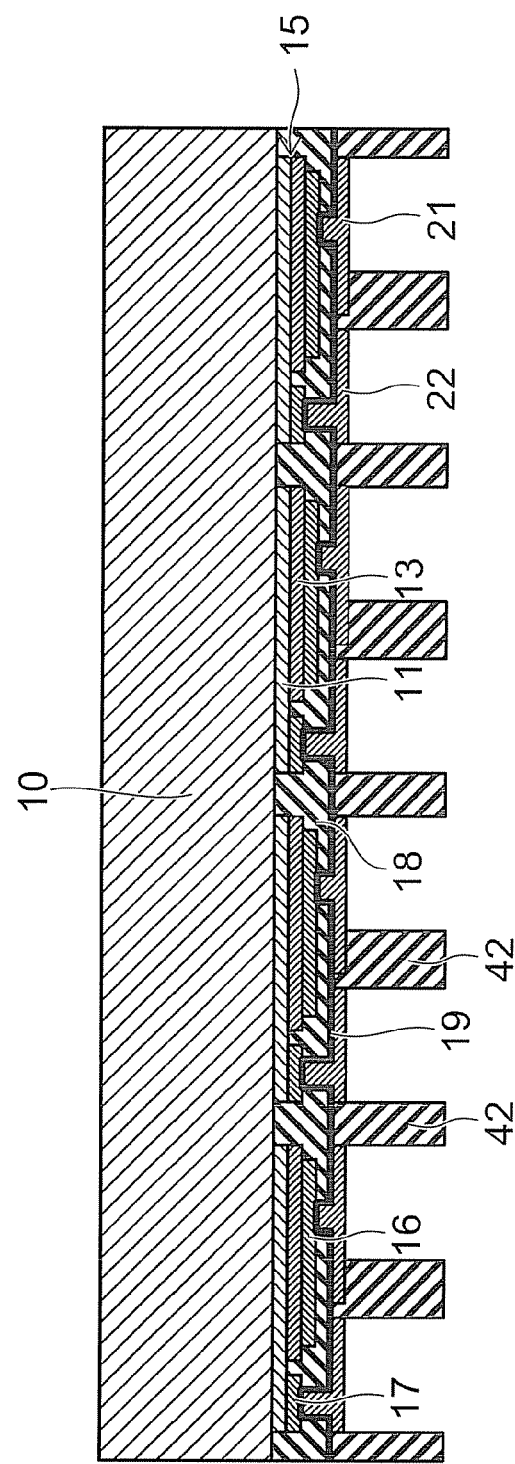
FIG. 5A
FIG. 5B

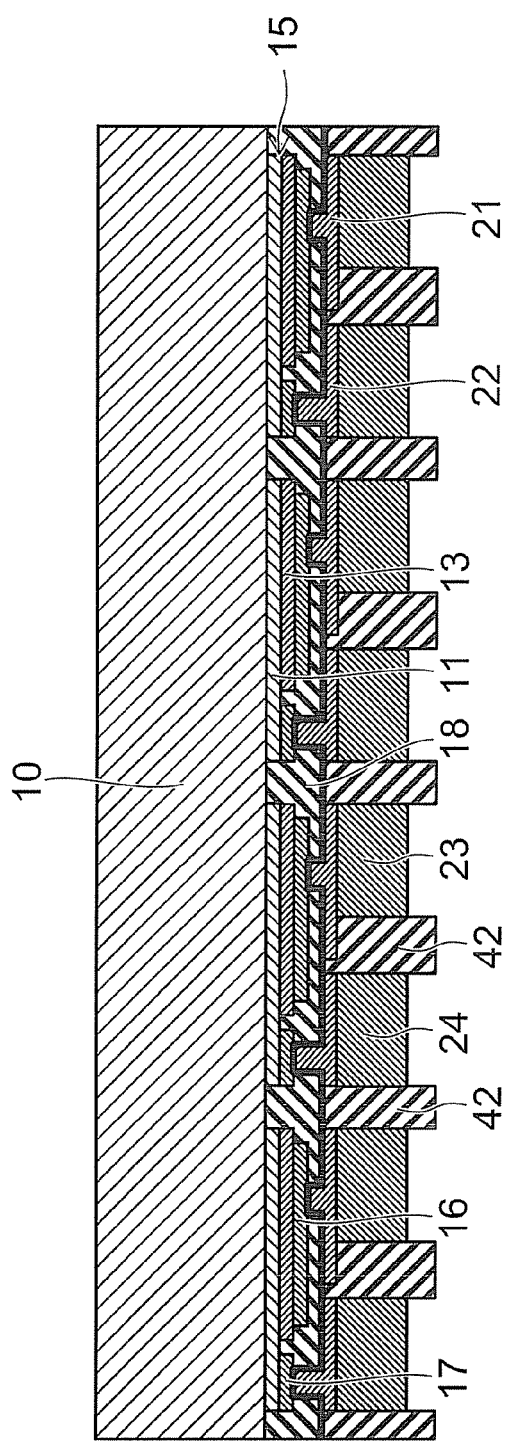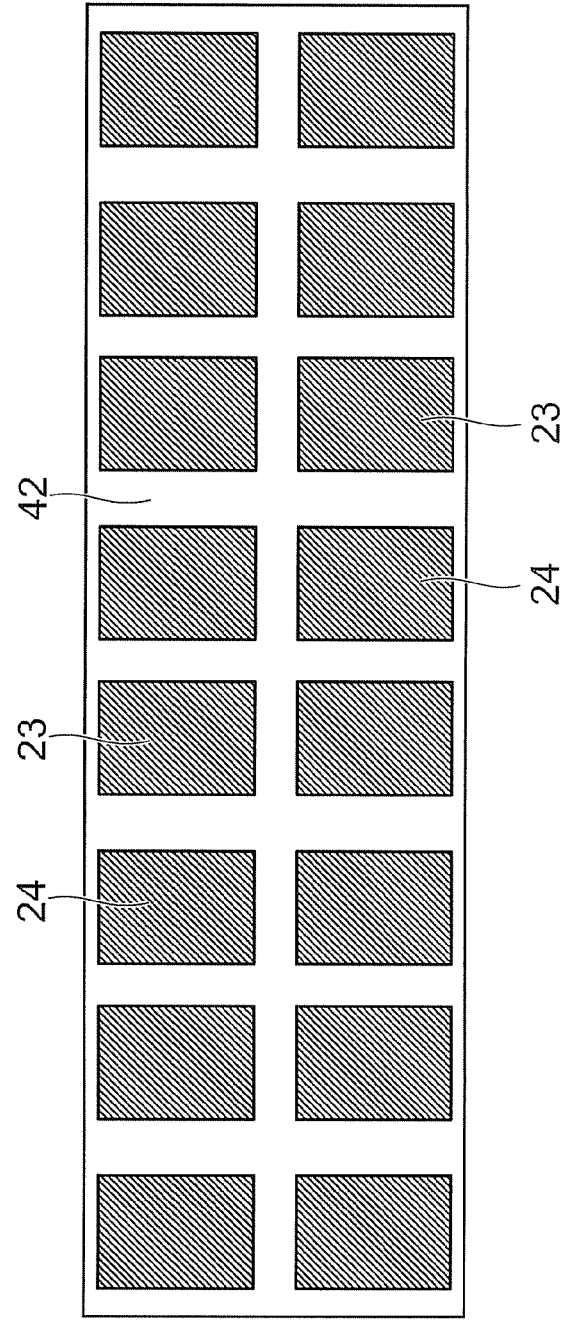
FIG. 6A
FIG. 6B

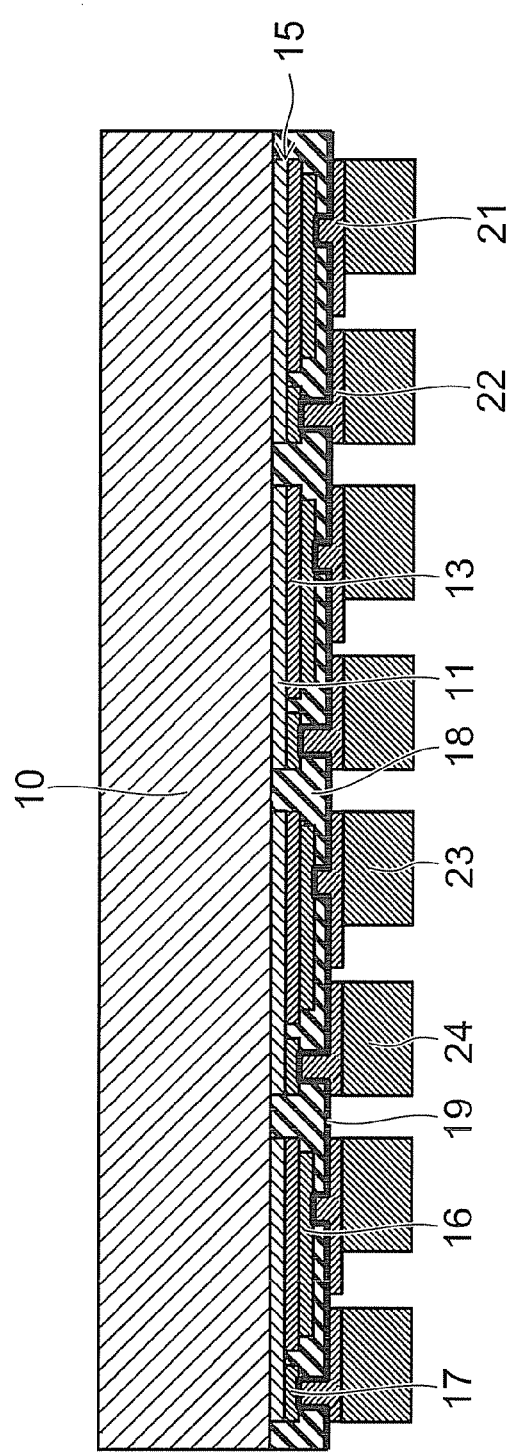
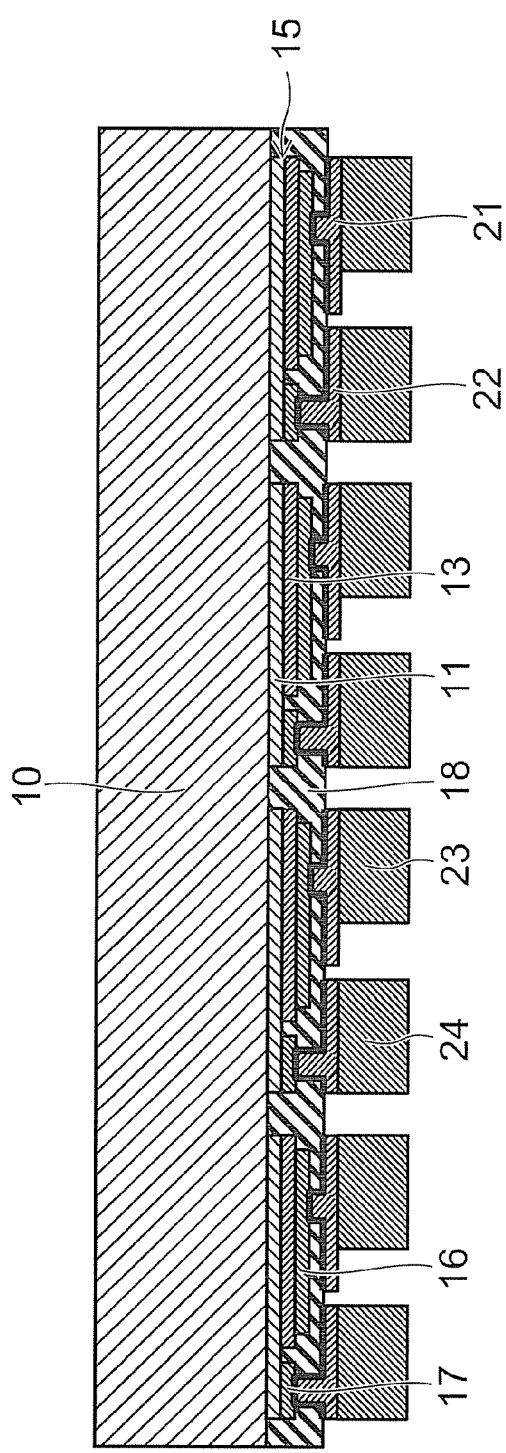
FIG. 7A
FIG. 7B

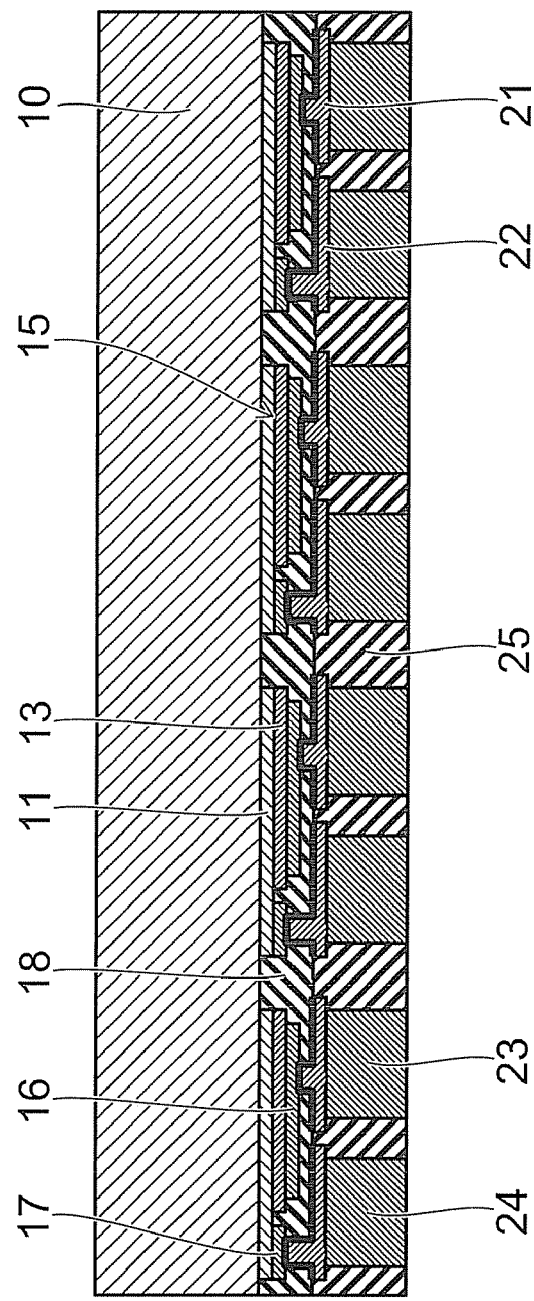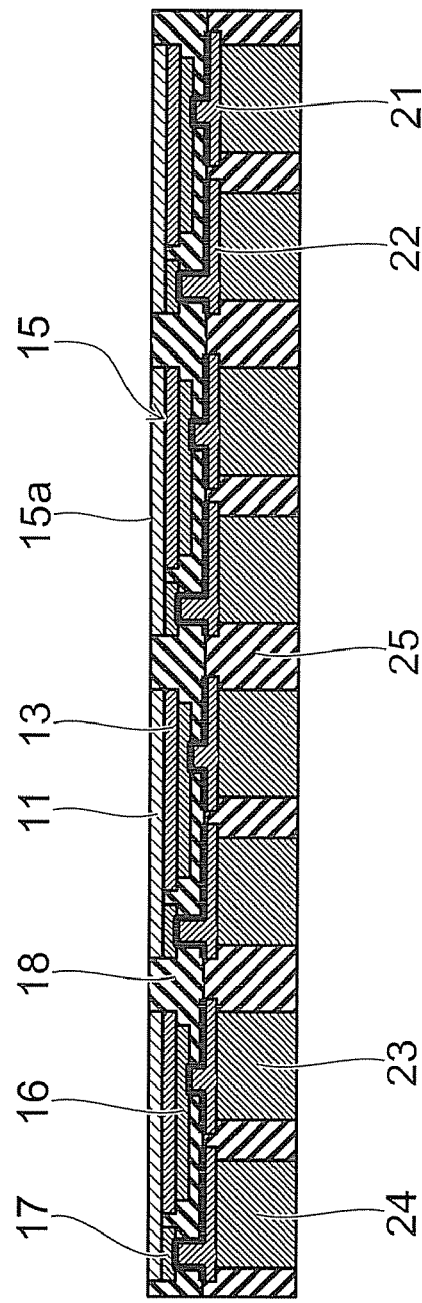
FIG. 8A
FIG. 8B

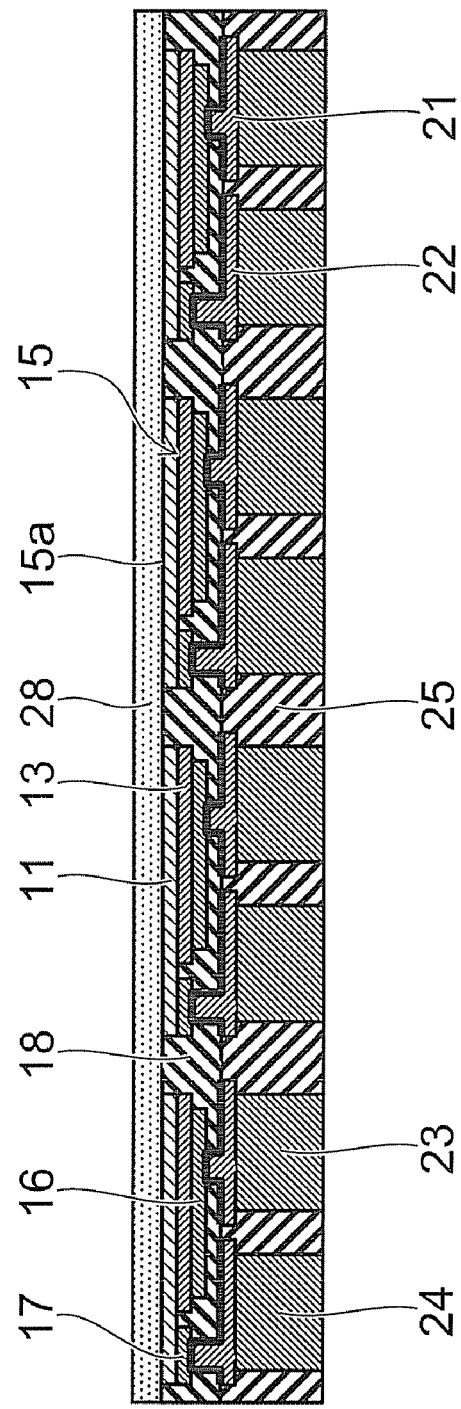
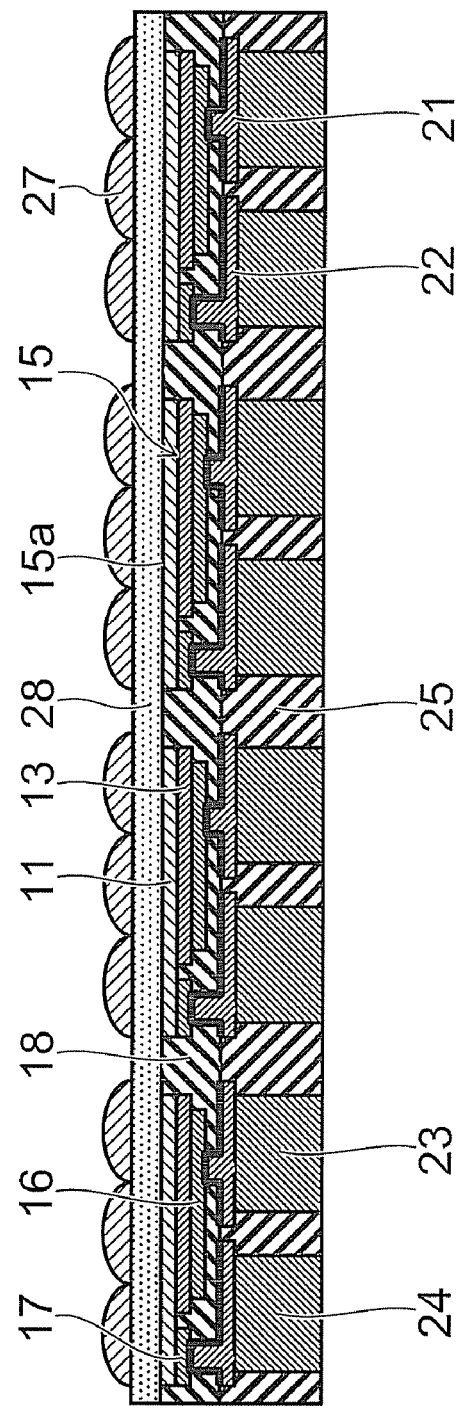
FIG. 9A
FIG. 9B

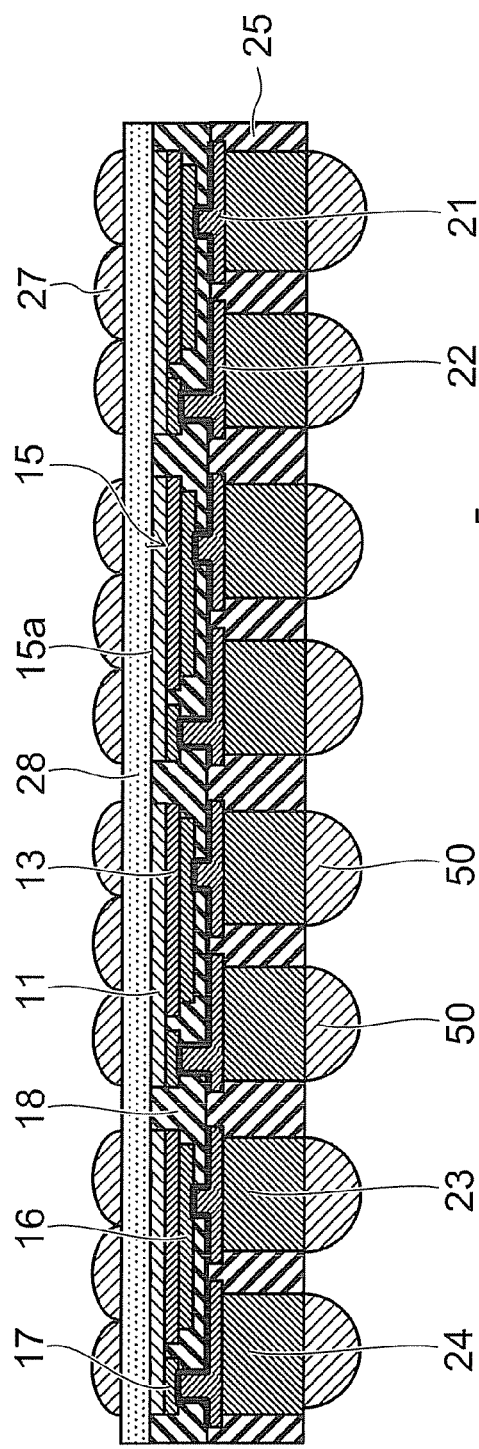
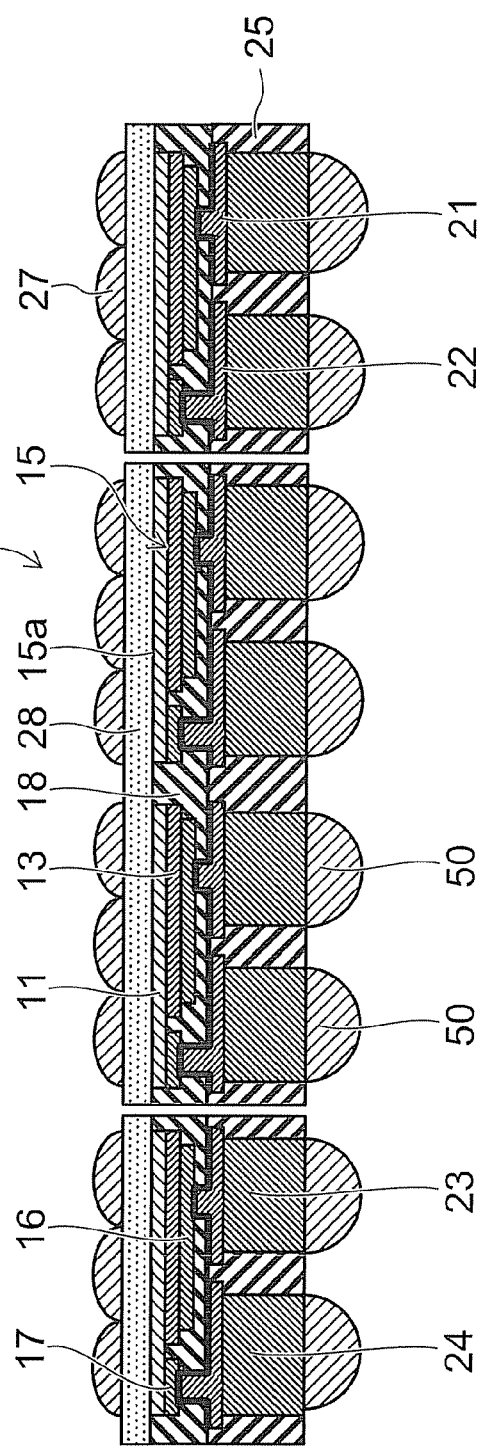
FIG. 10A
FIG. 10B

US 8,378,377 B2

LIGHT EMITTING DEVICE

CROSS-REFERENCE TO RELATED APPLICATION

This application is based upon and claims the benefit of priority from Japanese Patent Application No. 2010-120260, filed on May 26, 2010; the entire contents of which are incorporated herein by reference.

FIELD

Embodiments described herein relate generally to a light emitting device.

BACKGROUND

A light emitting device capable of emitting visible light or white light is used for wider purposes, such as for lighting equipment, a backlight source of an image display device and a display. In particular, to obtain a high luminous flux such as that of an incandescent light bulb, high current needs to be flown which inevitably causes heat generation. Thus, a high radiation performance is desired.

BRIEF DESCRIPTION OF THE DRAWINGS

FIGS. 2A to 10B are schematic views showing a method for manufacturing a light emitting chip of this embodiment;

DETAILED DESCRIPTION

Figure 1:
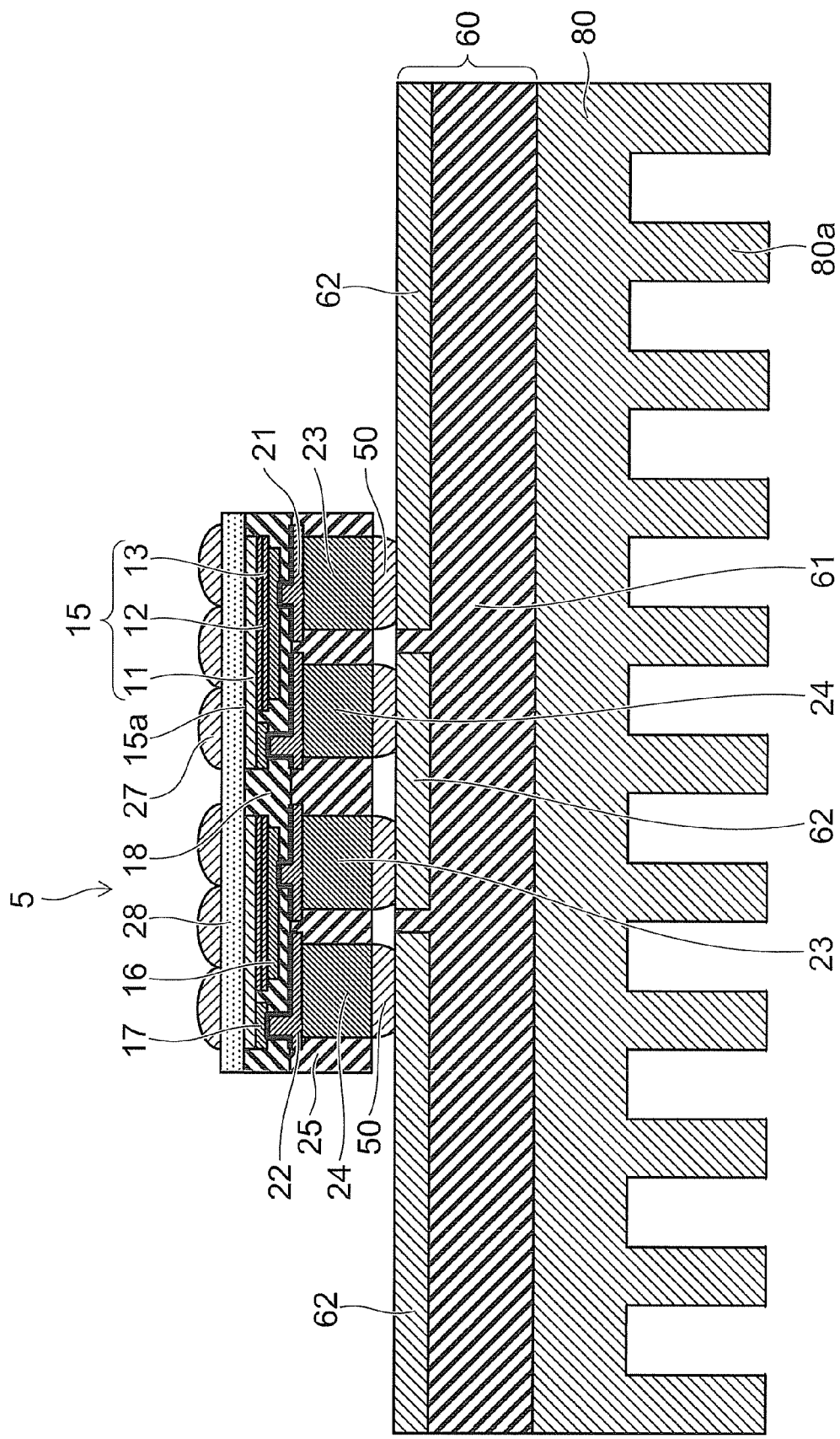
FIG. 1 is a schematic cross-sectional view of a light emitting device of a first embodiment.

According to one embodiment, a light emitting device includes a light emitting chip, an external terminal made of a metal material, and a circuit board. The light emitting chip is mounted on the circuit board via the external terminal.

The light emitting chip includes a semiconductor layer, a first electrode, a second electrode, an insulating layer, a first interconnection layer, a second interconnection layer, a first metal pillar, a second metal pillar and a resin layer. The semiconductor layer includes a first main surface, a second main surface formed on an opposite side of the first main surface, and a light emitting layer. The first electrode is provided on the second main surface in a region where the light emitting layer is provided. The second electrode is provided on the second main surface. The insulating layer is provided on the second main surface side of the semiconductor layer. The first interconnection layer is provided on a surface of the insulating layer opposite to a surface facing the semiconductor layer and provided in a first opening formed in the insulating layer to reach the first electrode. The first interconnection layer is connected to the first electrode. The second interconnection layer is provided on a surface of the insulating layer opposite to a surface facing the semiconductor layer and provided in a second opening formed to reach the second electrode. The second interconnection layer is connected to the second electrode. The first metal pillar is provided on a surface of the first interconnection layer opposite to a surface facing the first electrode. The second metal pillar is provided on the surface of the second interconnection layer opposite to the surface facing the second electrode. The resin layer is provided between a side surface of the first metal pillar and a side surface of the second metal pillar. The circuit board includes an interconnection bonded to the first metal pillar and the second metal pillar via the external terminal, and a heat radiation material provided on an opposite side of the interconnection and connected to the interconnection.

Hereinbelow, embodiments are described with reference to the drawings. Note that the same component is assigned the same reference numeral in the drawings, and the drawings indicating a process show a partial region of a wafer.

First Embodiment

FIG. 1 is a schematic cross-sectional view of a light emitting device of a first embodiment.

The light emitting device of this embodiment includes a light emitting chip 5, external terminals 50 and a circuit board 60 on which the light emitting chip 5 is mounted via the external terminals 50.

The light emitting chip 5 includes a semiconductor layer 15. For example, in this embodiment, the light emitting chip 5 includes multiple semiconductor layers 15 which are separated from each other. Each semiconductor layer 15 includes a first main surface 15a and a second main surface formed on the opposite side thereof. Electrodes and interconnection layers are provided on the second main surface side. Light is mainly extracted from the first main surface 15a.

Each semiconductor layer 15 includes a first semiconductor layer 11 and a second semiconductor layer 13. The first semiconductor layer 11 is an n-type GaN layer, for example, and functions as a transverse passage for a current. Note that the conductivity type of the first semiconductor layer 11 is not limited to the n-type, and may be a p-type. The second semiconductor layer 13 has a stacked structure in which a light emitting layer (active layer) 12 is interposed between an n-type layer and a p-type layer.

The second main surface (bottom surface in FIG. 1) side of the semiconductor layer 15 is processed into an uneven form, and an upper part and a lower part are provided in the second main surface side of the semiconductor layer 15. The upper part which is positioned above the lower part as seen from the first main surface 15a includes the light emitting layer 12. The lower part does not include the light emitting layer 12, and is provided outside the outer circumference (edge) of the light emitting layer 12.

A p-side electrode 16 is provided as a first electrode on a surface of the second semiconductor layer 13, which is a surface of the upper part. In other words, the p-side electrode 16 is provided in a region where the light emitting layer 12 is provided. An n-side electrode 17 is provided as a second electrode on a surface of the first semiconductor layer 11 in the lower part.

Figure 2A:
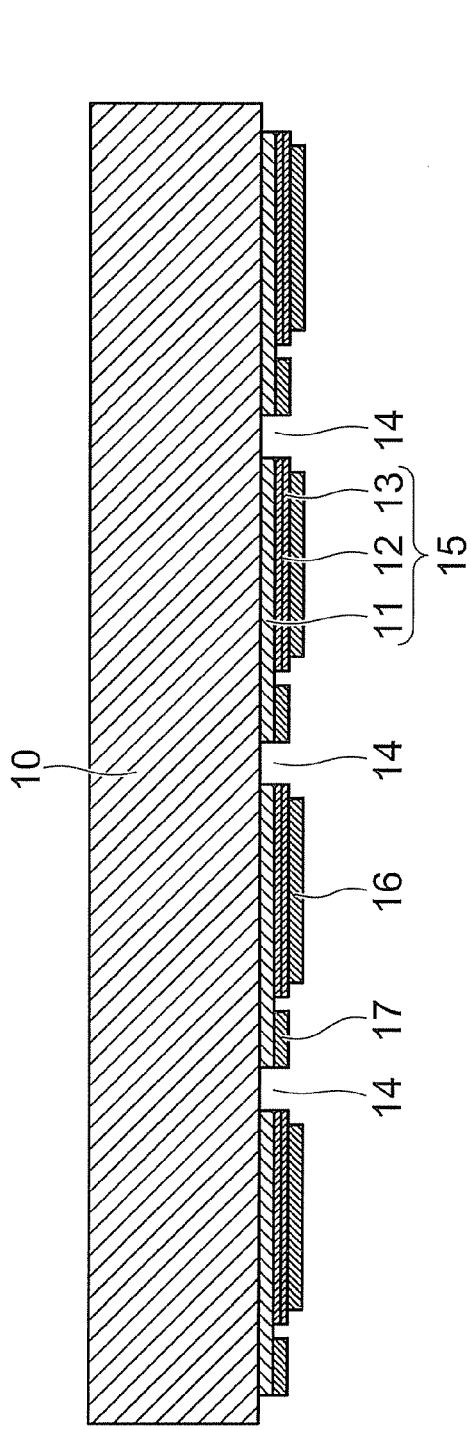
Figure 2B:
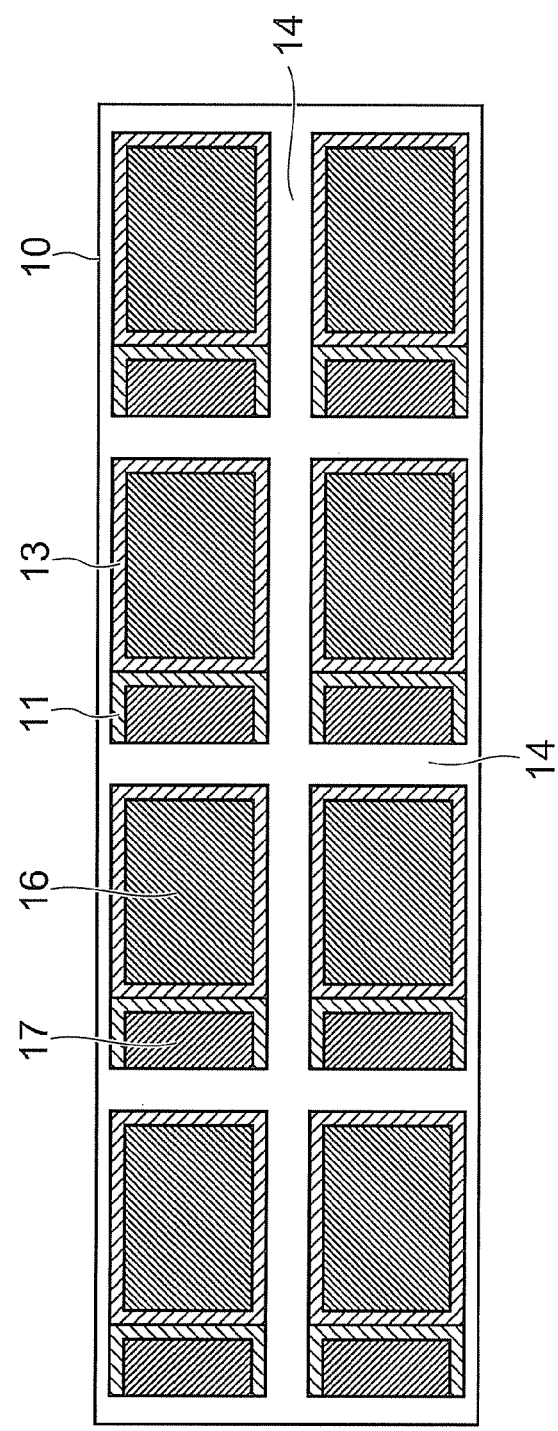

FIG. 2B shows an example of a planar layout of the p-side electrode 16 and the n-side electrode 17. An area of the p-side electrode 16 is larger than an area of the n-side electrode in a single semiconductor layer 15. Accordingly, a broad emission region can be ensured.

The second main surface side of the semiconductor layer 15 is covered with an insulating layer 18. The insulating layer 18 is also filled among multiple semiconductor layers 15 which are adjacent to each other, and edges (side surfaces) of each of the semiconductor layers 15 are covered with the insulating layer 18. The insulating layer 18 is also filled between the p-side electrode 16 and the n-side electrode 17. The insulating layer 18 is, for example, resin such as polyimide having excellent patterning property in forming a fine opening. Alternatively, silicone oxide may be used as the insulating layer 18.

In the insulating layer 18, a surface opposite to a surface facing the semiconductor layer 15 is planarized, and a p-side interconnection layer 21 as a first interconnection layer and an n-type interconnection layer 22 as a second interconnection layer are provided thereon. The p-side interconnection layer 21 is also provided inside a first opening 18a formed in the insulating layer 18 to reach the p-side electrode 16, and is connected to the p-side electrode 16. The n-side interconnection layer 22 is also provided inside a second opening 18b formed in the insulating layer 18 to reach the n-side electrode 17, and is connected to the n-side electrode 17.

On a surface of the p-side interconnection layer 21 opposite to a surface facing the p-side electrode 16, a p-side metal pillar 23 is provided as a first metal pillar. On a surface of the n-side interconnection layer 22 opposite to a surface facing the n-side electrode 17, an n-side metal pillar 24 is provided as a second metal pillar.

The circumference of the p-side metal pillar 23, the circumference of the n-side metal pillar 24, the p-side interconnection layer 21 and the n-side interconnection layer 22 are covered with a resin layer 25. The resin layer 25 is filled between adjacent pillars. Bottom surfaces of the p-side metal pillar 23 and the n-side metal pillar 24 are exposed from the resin layer 25.

The n-side interconnection layer 22 is connected to the n-side electrode 17 which is provided in each of the semiconductor layers 15 in a part where the light emitting layer 12 is not formed. The surface area of the n-side interconnection layer 22 is larger on the opposite side of the n-side electrode 17 than that on the n-side electrode 17 side. In other words, a contact area between the n-side interconnection layer 22 and the n-side metal pillar 24 is larger than a contact area between the n-side interconnection layer 22 and the n-side electrode 17. A contact area between the p-side interconnection layer 21 and the p-side metal pillar 23 is larger than a contact area between the p-side interconnection layer 21 and the p-side electrode 16. In addition, a part of the n-side interconnection layer 22 is extended on the insulating layer 18 to overlap a position under the light emitting layer 12.

Accordingly, a high optical output by a broader light emitting layer 12 is maintained while a broader extraction electrode can be formed, via the n-side interconnection layer 22, from the n-side electrode 17 provided in a narrow area in the semiconductor layer 15 where the light emitting layer 12 is not formed.

The first semiconductor layer 11 is electrically connected to the n-side metal pillar 24 via the n-side electrode 17 and the n-side interconnection layer 22. The second semiconductor layer 13 is electrically connected to the p-side metal pillar 23 via the p-side electrode 16 and the p-side interconnection layer 21.

Incidentally, a topcoat film (such as precoated solder and an electroless plating film of Ni or Au) is formed according to need for prevention of rust and the like on surfaces (bottom surfaces in FIG. 1) of the p-side metal pillar 23 and the n-side metal pillar 24.

Materials of the n-side interconnection layer 22, the p-side interconnection layer 21, the n-side metal pillar 24 and the p-side metal pillar 23 include copper, gold, nickel and silver. Among these materials, copper is more preferable from the point of high thermal conductivity, high migration resistance and high adhesion on an insulator.

The insulating layer 18 is patterned to form multiple fine openings 18a and 18b. For this reason, preferably used as the insulating layer 18 is resin such as polyimide having excellent patterning property in forming a fine opening.

Preferably used as the resin layer 25 is resin that can be formed thickly at low cost and that is appropriate for reinforcing the n-side metal pillar 24 and the p-side metal pillar 23. For example, epoxy resin, silicone resin and fluoropolymer resin may be cited as examples of the resin layer 25.

A phosphor layer 28 is provided on the first main surface 15a of the semiconductor layer 15. Lenses 27 are provided on the phosphor layer 28. The phosphor layer 28 is provided integrally to straddle above the first main surface 15a of each of the semiconductor layers 15 and above the insulating layers 18 each filled between adjacent semiconductor layers 15.

The phosphor layer 28 is capable of absorbing light emitted from the light emitting layer 12 and thereby emitting a wavelength-converted light. Accordingly, it is possible to emit a mixed light including light emitted from the light emitting layer 12 and wavelength-converted light emitted from the phosphor layer 28. For example, in the case of a nitride based light emitting layer 12, white, warm white or the like can be obtained as a mixture of blue light from the light emitting layer 12 and yellow light being a wavelength-converted light emitted from a yellow phosphor layer 28, for example. Note that the phosphor layer 28 may be configured to include multiple kinds of phosphors (such as a red phosphor and a green phosphor).

Light emitted from the light emitting layer 12 mainly passes through the first semiconductor layer 11, the first main surface 15a, the phosphor layer 28 and the lens 27 to be emitted to the outside.

Bottom surfaces of the p-side metal pillar 23 and the n-side metal pillar 24 are bonded to interconnections 62 formed on a surface of the circuit board 60 via the external terminals 50 made of solder or another metal material in the shape of balls or bumps.

The circuit board 60 includes interconnections 62 and a heat radiation material provided under the interconnections 62 in contact therewith. The heat radiation material is an insulative ceramic substrate 61. The material of the ceramic substrate 61 is aluminum nitride, beryllium oxide or aluminum oxide, for example. Among these materials, aluminum nitride is more preferably used for its high thermal conductivity and high electrical insulation property.

The ceramic substrate 61 being the heat radiation material is thicker than the interconnections 62. The interconnection 62 is made of a metal material such as copper, and is laid out in a desired pattern on a surface of the ceramic substrate 61. The ceramic substrate 61 supports the interconnections 62 and serves as an insulator among the interconnections 62.

Adjacent metal pillars to be connected to different semiconductor layers 15 and having different polarities are bonded to a common interconnection 62. For example, of the two adjacent semiconductor layers 15 in FIG. 1, the p-side metal pillar 23 is provided to correspond to one semiconductor layer 15, the n-side metal pillar 24 is provided to correspond to the other semiconductor layer 15, and both pillars are bonded to a common interconnection 62 shown in the center of FIG. 1.

Specifically, two semiconductor layers 15 are connected in series. High output can be obtained easily by connecting multiple semiconductor layers 15 in series. Moreover, the interconnection 62 is not required for every metal pillar (or for every external terminal 50), so that the width or pitch of the interconnections 62 need not be made finely, which improves the reliability of the interconnections 62.

Note that the number of semiconductor layers 15 to be connected in series is not limited to two, and a larger number of semiconductor layers 15 may be connected in series. Alternatively, multiple semiconductor layers 15 may be connected in parallel.

Figure 15:
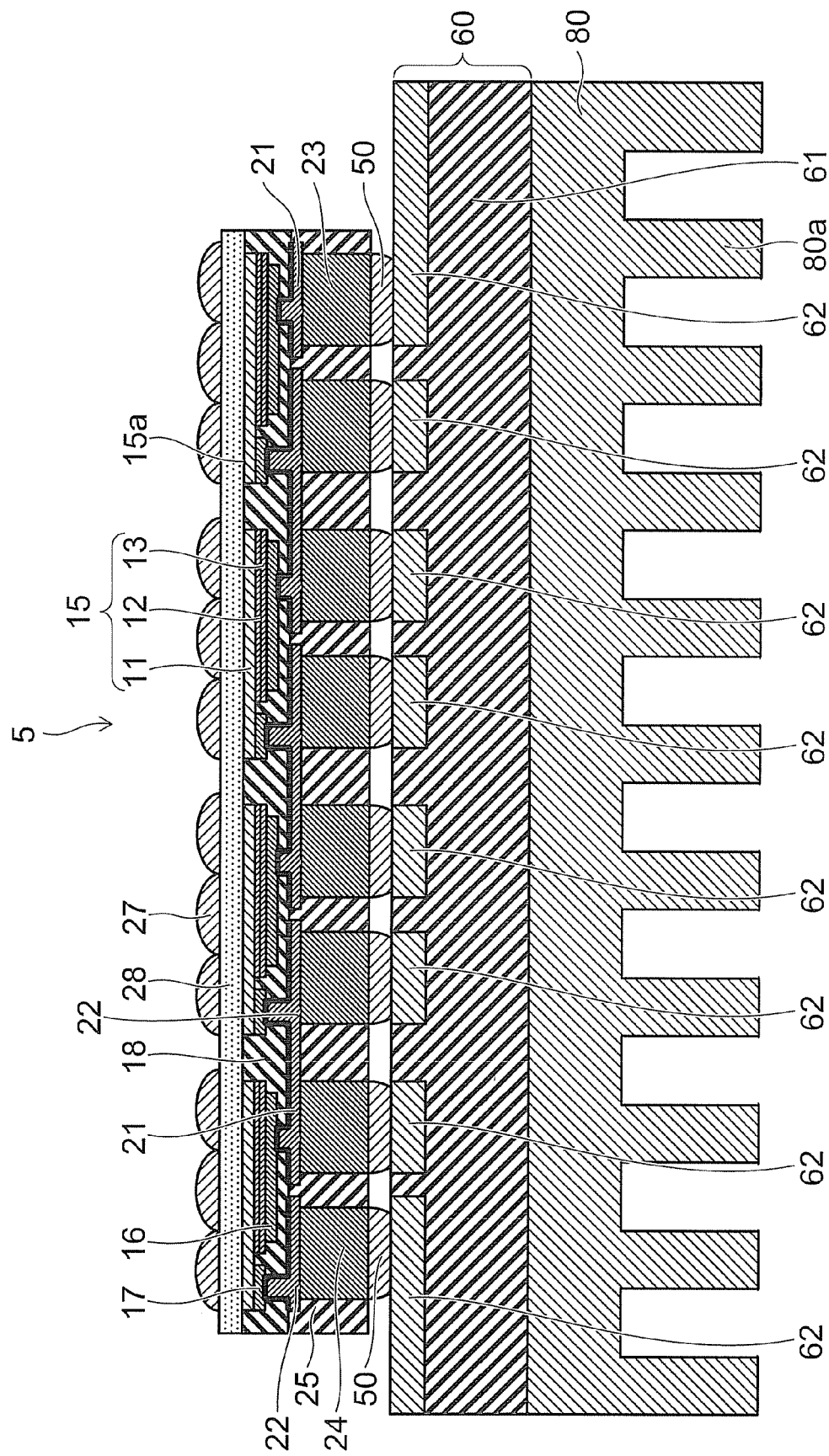
FIG. 15 is a schematic cross-sectional view of a light emitting device of a variation.

Additionally, as shown FIG. 15, the interconnection 62 may be formed for each of the metal pillars 23 and 24 (or for the external terminal 50). In this case, to connect multiple semiconductor layers 15 in series, adjacent p-side interconnection layer 21 and n-side interconnection layer 22 to be connected to different semiconductor layers 15 and having different polarities may be bonded together on a surface of the insulating layer 18.

The thickness of each of the n-side metal pillar 24 and the p-side metal pillar 23 (thicknesses in the vertical direction in FIG. 1) is thicker than the thickness of a stacked body including the semiconductor layer 15, the n-side electrode 17, the p-side electrode 16, the insulating layer 18, the n-side interconnection layer 22 and the p-side interconnection layer 21. The aspect ratio (ratio of thickness to horizontal size) of each of the metal pillars 23 and 24 is not limited to 1 or more, and may be lower than 1. In other words, the thickness of each of the metal pillars 23 and 24 may be smaller than the horizontal size thereof.

According to the structure of this embodiment, even with a thin semiconductor layer 15, mechanical strength can be maintained by forming the n-side metal pillar 24, the p-side metal pillar 23 and the resin layer 25 thickly. In addition, a stress applied to the semiconductor layer 15 via the external terminals 50 is eased by being absorbed by the n-side metal pillar 24 and the p-side metal pillar 23.

In the light emitting chip 5, elements such as the electrodes 16 and 17, the interconnection layers 21 and 22, and the metal pillars 23 and 24 which are made of metal having high thermal conductivity are formed at portions closer to the mounting surface than the semiconductor layer 15 is. With this configuration, heat generated in the semiconductor layer 15 can be efficiently conducted downward toward the mounting surface side. Further, the metal pillars 23 and 24 are bonded to the interconnections 62 made of a metal material via the external terminals 50 also made of a metal material, and the ceramic substrate 61 having high thermal conductivity is provided under the interconnections 62. Accordingly, the light emitting device, as a whole, has high thermal conductivity toward the lower part of the device, radiation toward the lower part thereof is facilitated, and luminous efficiency is improved.

The ceramic substrate 61 is an insulator. For this reason, even when the back surface (the surface opposite to the surface on which the interconnection 62 is formed) of the ceramic substrate 61 is contacted with a metal body 80 to incorporate the light emitting device into lighting equipment or the like, short circuit does not occur among the interconnections 62. The radiation property is further enhanced by bonding the back surface of the ceramic substrate 61 to the metal body 80. Additionally, by providing a fin structure 80a in the metal body 80, a radiation area is enlarged to still further enhance the radiation property. The metal body 80 may be a housing of the lighting equipment or the like into which the light emitting device is incorporated, or may be provided separately from the housing.

Next, a method for manufacturing the light emitting chip 5 is described with reference to FIGS. 2A to 10B.

Firstly, the first semiconductor layer 11 is formed on a main surface of a substrate 10, and the second semiconductor layer 13 including the light emitting layer 12 is formed thereon. In a case where the semiconductor layer 15 (the first semiconductor layer 11 and the second semiconductor layer 13) is nitride-based semiconductor, for example, the semiconductor layer 15 may be crystal grown on a sapphire substrate, for example.

Next, a separating groove 14 is formed as shown in FIG. 2A and FIG. 2B which is a bottom view of FIG. 2A by a reactive ion etching (RIE) method, for example, using an unillustrated resist. The separating groove 14 is formed to penetrate the semiconductor layer 15 to reach the substrate 10. The separating groove 14 is formed in a lattice pattern on the substrate 10 being a wafer, and segments the semiconductor layer 15 into multiple pieces.

In addition, a part of the second semiconductor layer 13 including the light emitting layer 12 is removed by the RIE method, for example, using an unillustrated resist, so that a part of the first semiconductor layer 11 is exposed. Thus, the upper part positioned in an upper part as seen from the substrate 10, and the lower part positioned in a lower part closer to the substrate 10 than the upper part are formed on the second main surface side of the semiconductor layer 15. The upper part includes the light emitting layer 12 and the lower part does not include the light emitting layer 12.

Then, the p-side electrode 16 is formed on a surface of the upper part (a surface of the second semiconductor layer 13), and the n-side electrode 17 is formed on a surface of the lower part (a surface of the first semiconductor layer 11). Any one of the p-side electrode 16 and the n-side electrode 17 may be formed first, or otherwise, the p-side electrode 16 and the n-side electrode 17 may be formed simultaneously with the same material.

Then, after covering all of exposed parts of the substrate 10 with the insulating layer 18, the insulating layer 18 is patterned as shown in FIG. 3A by wet etching, for example, to selectively form the first opening 18a and the second opening 18b in the insulating layer 18. The first opening 18a reaches the p-side electrode 16, whereas the second opening 18b reaches the n-side electrode 17. The insulating layer 18 is filled in the separating groove 14.

Next, as shown in FIG. 3B, a continuous seed metal 19 is formed on a surface of the insulating layer 18 and on inside surfaces of the first opening 18a and the second opening 18b. In addition, resists 41 are selectively formed on the seed metal 19 and copper electroplating is performed by using the seed metal 19 as a current path.

Figure 4A:
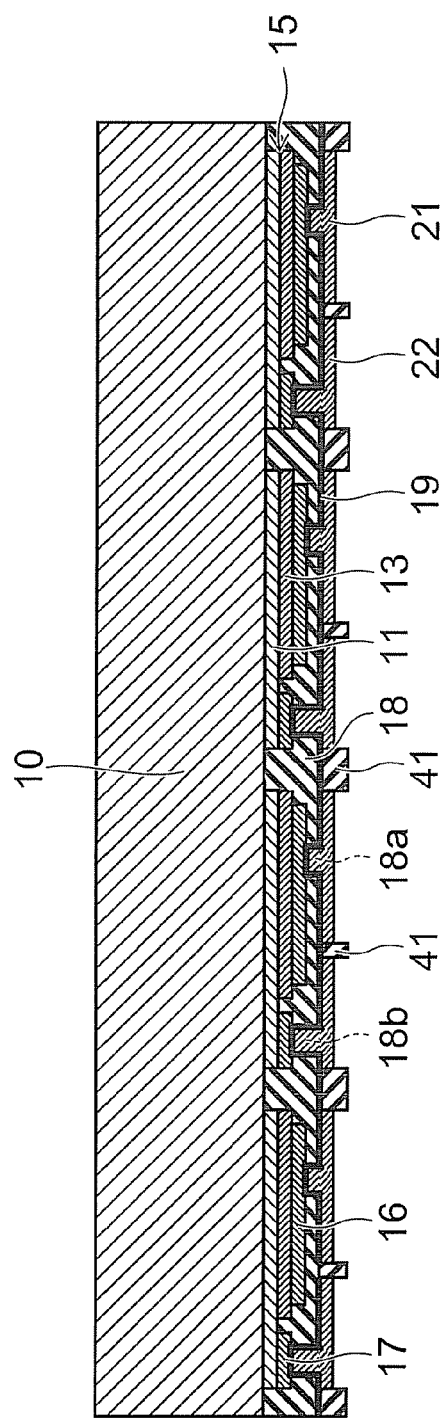
Figure 4B:
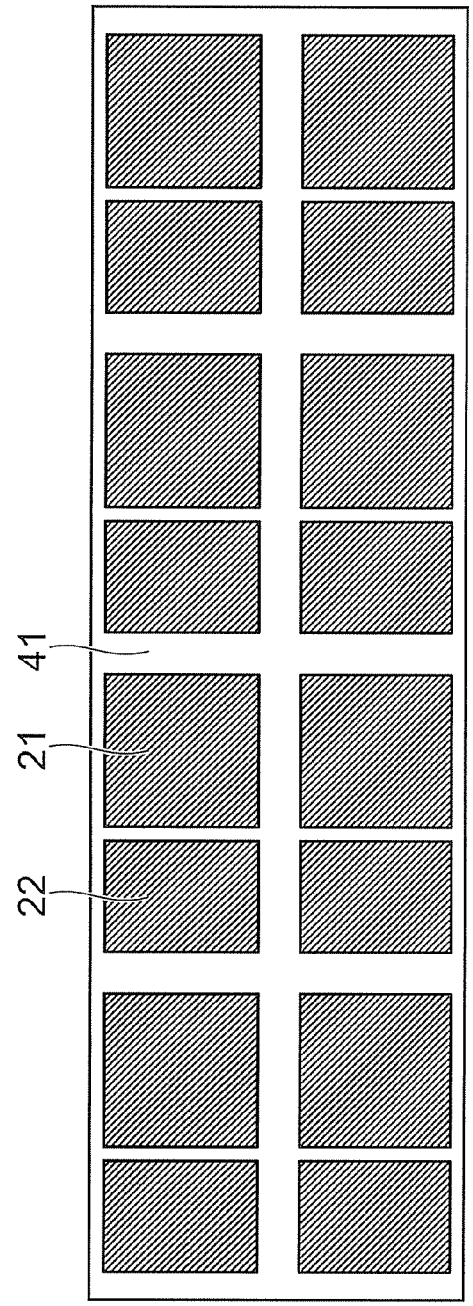

Thus, as shown in FIG. 4A and FIG. 4B which is a bottom view of FIG. 4A, the p-side interconnection layer 21 and the n-side interconnection layer 22 are selectively formed on the seed metal 19. The p-side interconnection layer 21 and the n-side interconnection layer 22 are made of a copper material simultaneously formed by plating. The p-side interconnection layer 21 is also formed inside the first opening 18a, and is connected to the p-side electrode 16 via the seed metal 19. The n-side interconnection layer 22 is also formed inside the second opening 18b, and is connected to the n-side electrode 17 via the seed metal 19.

The surface of the n-side interconnection layer 22 opposite to the surface facing the n-side electrode 17 is formed into a pad shape on a surface of the insulating layer 18, with an area larger than that of the surface at which the n-side interconnection layer 22 connects with the n-side electrode 17. Similarly, the surface of the p-side interconnection layer 21 opposite to the surface facing the p-side electrode 16 is formed into a pad shape on a surface of the insulating layer 18, with an area larger than that of the surface at which the p-side interconnection layer 21 connects with the p-side electrode 16.

The resists 41 used for plating the p-side interconnection layer 21 and the n-side interconnection layer 22 are removed by a chemical, for example (FIG. 5A). Thereafter, as shown in FIG. 5B, other resists 42 for forming metal pillars are formed, and copper electroplating is performed by using the seed metal 19 as a current path. The resist 42 is thicker than the resist 41.

Thus, as shown in FIG. 6A and FIG. 6B which is a bottom view of FIG. 6A, the p-side metal pillar 23 is formed on a surface of the p-side interconnection layer 21, and the n-side metal pillar 24 is formed on a surface of the n-side interconnection layer 22. The p-side metal pillar 23 and the n-side metal pillar 24 are made of a copper material simultaneously formed by plating.

As shown in FIG. 7A, the resists 42 are removed by a chemical, for example. Thereafter, exposed parts of the seed metal 19 are wet etched by using the p-side metal pillar 23 and the n-side metal pillar 24 as a mask (FIG. 7B). Thus, electrical connection between the p-side interconnection layer 21 and the n-side interconnection layer 22 via the seed metal 19 is cut off.

Next, as shown in FIG. 8A, the resin layer 25 is stacked on the insulating layer 18. The resin layer 25 is filled between the p-side interconnection layer 21 and the n-side interconnection layer 22, as well as between the p-side metal pillar 23 and the n-side metal pillar 24. Side surfaces of each of the p-side metal pillar 23 and the n-side metal pillar 24 is covered with the resin layer 25. A back surface of the resin layer 25 is ground, and bottom surfaces of the p-side metal pillar 23 and the n-side metal pillar 24 are exposed.

Then, as shown in FIG. 8B, the substrate 10 is removed. The substrate 10 is removed by a laser lift-off process, for example. To be specific, the first semiconductor layer 11 is irradiated with a laser beam from the back surface side of the substrate 10. The laser beam has a wavelength to transmit the substrate 10, and to be absorbed by the first semiconductor layer 11.

When the laser beam reaches an interface between the substrate 10 and the first semiconductor layer 11, the first semiconductor layer 11 near the interface is decomposed by absorbing energy of the laser beam. For example, in a case where the first semiconductor layer 11 is GaN, the first semiconductor layer 11 is decomposed into Ga and nitrogen gas. This decomposition reaction causes a small gap between the substrate 10 and the first semiconductor layer 11, and thus the substrate 10 and the first semiconductor layer 11 are separated.

Here, the layer made of the resin and the metal is flexible, and the metal is formed by plating at near room temperature. Hence, the residual stress occurring with respect to the translucent substrate 10 is relatively low.

In the conventional technique for separating the semiconductor layer from the translucent substrate at wafer level, for example, it is bonded to a silicon substrate with a metal layer formed thereon using Au—Sn solder at a high temperature of 300° C. or more, and then the semiconductor layer made of GaN is separated by laser irradiation. However, in this conventional technique, the translucent substrate and the silicon substrate being different in thermal expansion coefficient are both rigid, and are bonded together at high temperature. Hence, a high residual stress remains between these substrates. Consequently, when the separation is started by laser irradiation, the residual stress is locally relieved from the separated portion and unfortunately causes cracks in the thin, brittle semiconductor layer.

In contrast, in this embodiment, the residual stress is low, and the semiconductor layer 15 is separated in the state of being fixed to a flexible support. Hence, the device can be manufactured at high yield without trouble such as cracking in the semiconductor layer 15.

The substrate 10 is removed by radiating the laser beam on the entire wafer, the laser beam being sequentially radiated on predetermined regions. Light extraction efficiency can be enhanced by removing the substrate 10 from the first main surface 15a.

The surface from which the substrate 10 is removed is cleaned, and is roughened by a frosting process. Light extraction efficiency can be enhanced by roughening the first main surface 15a.

Then, as shown in FIG. 9A, the phosphor layer 28 is formed on the first main surfaces 15a as well as on the insulating layers 18 each being filled between adjacent semiconductor layers 15. For example, transparent liquid resin in which phosphor grains are dispersed is applied by spin coating and then heat-cured to form the phosphor layer 28. Further, as shown in FIG. 9B, the lenses 27 are formed on the phosphor layer 28.

Thereafter, as shown in FIG. 10A, the external terminals 50 are provided to bottom surfaces of the p-side metal pillar 23 and the n-side metal pillar 24. Note that the external terminals 50 may be provided on the circuit board 60 side.

Then, the wafer is diced along the separating groove 14 (FIGS. 2A and 2B) into individual light emitting chips 5 (FIG. 10B). The substrate 10 is already removed at the time of dicing. Moreover, the semiconductor layer 15 is not provided in the separating groove 14 and resin may be filled therein as the insulating layer 18. In this way, the wafer is more easily diced and productivity can be improved. In addition, the semiconductor layer 15 can be prevented from being damaged at the time of dicing. Furthermore, a configuration in which ends (side surfaces) of the semiconductor layer 15 are covered with resin is obtained after the individual chips are cut out.

Figure 11:
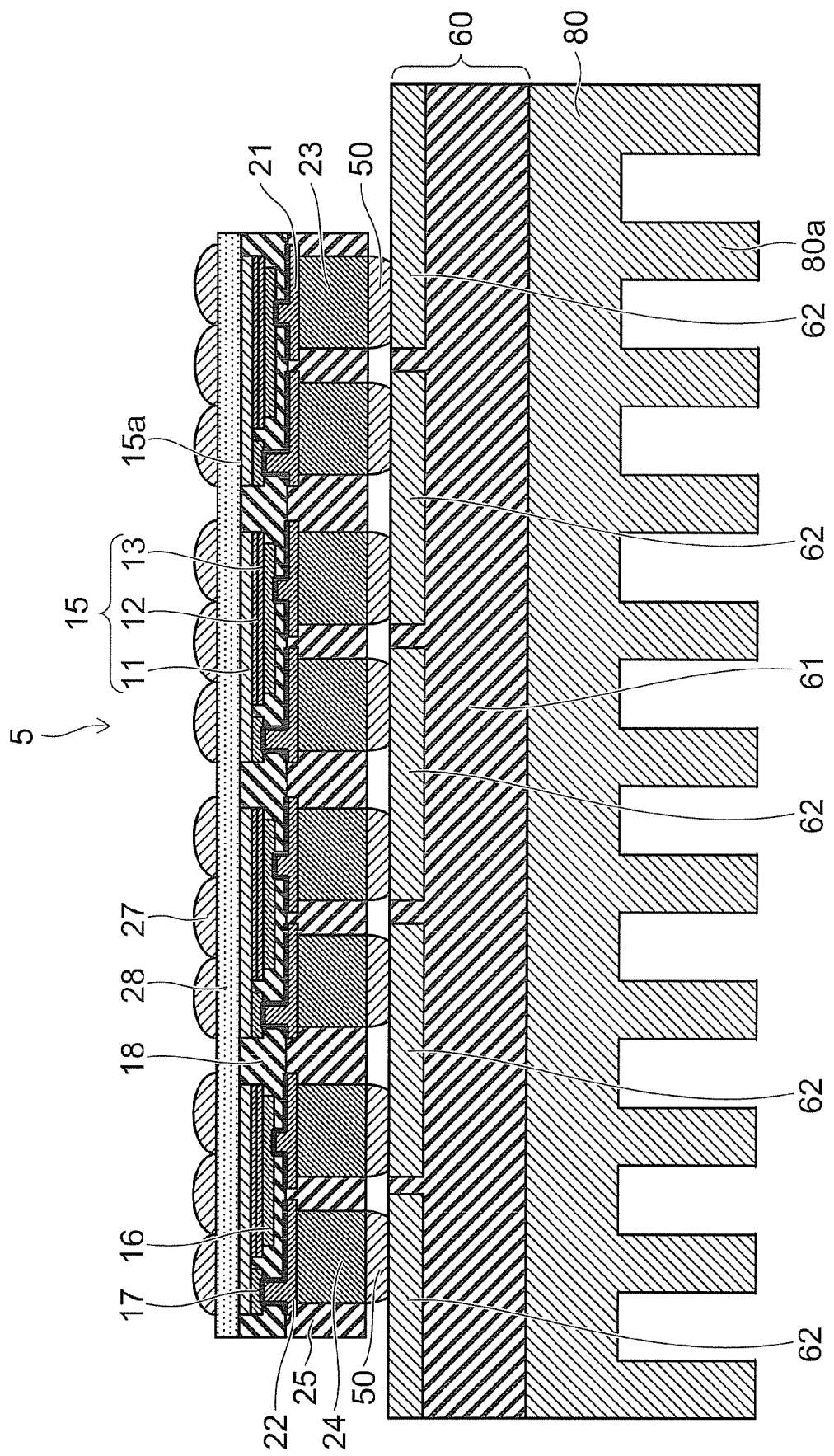
FIG. 11 is a schematic cross-sectional view showing another specific example of the light emitting chip.
Figure 16:
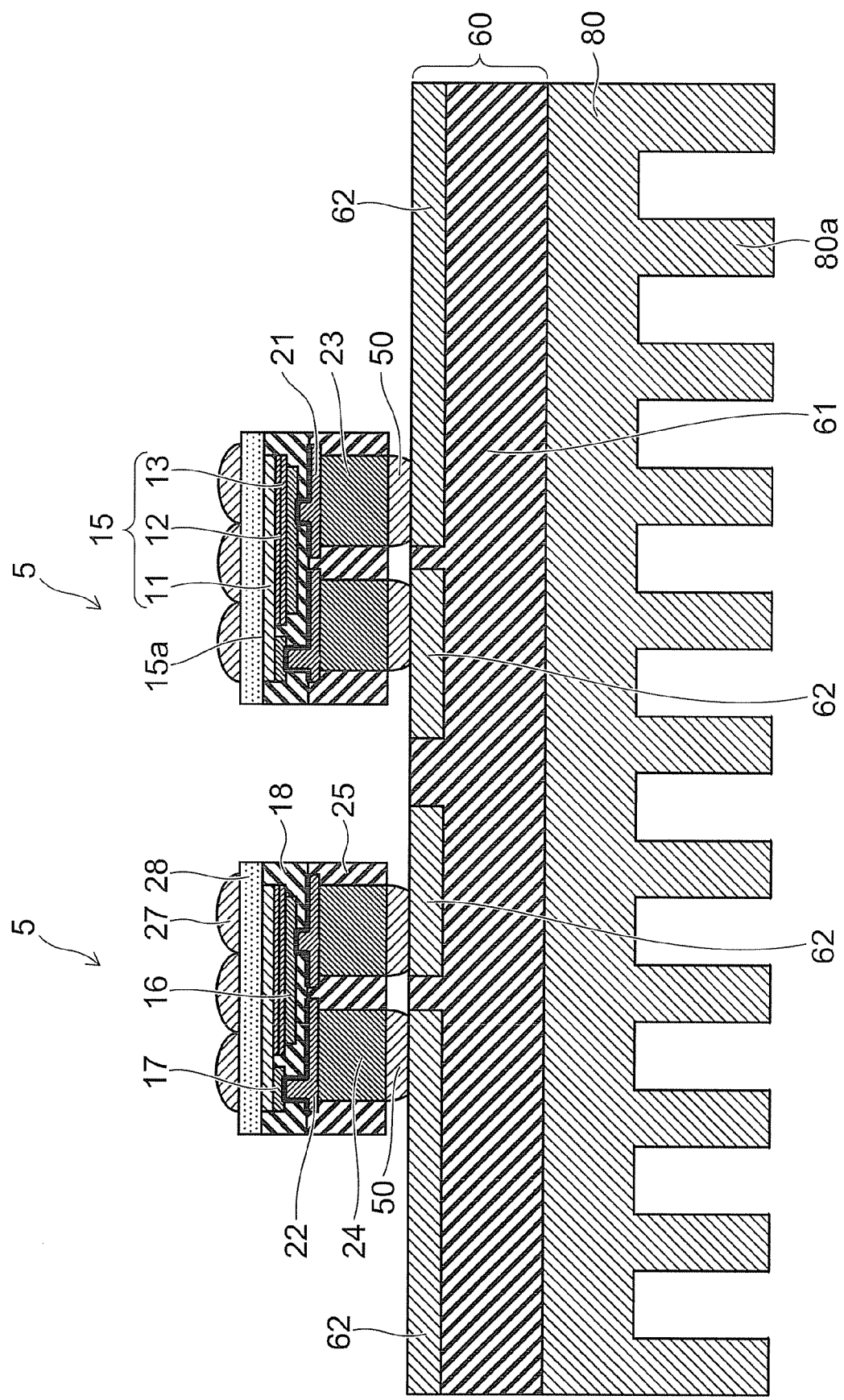
FIG. 16 is a schematic cross-sectional view of a light emitting device of another variation.

After being cut out, each light emitting chip 5 includes multiple semiconductor layers 15. As shown in FIG. 11, the light emitting chip 15 may be configured to include a larger number of semiconductor layers 15. Alternatively, each of the cut-out light emitting chips 5 may be configured to include a single semiconductor layer 15. In this case, as shown in FIG. 16, multiple light emitting chips 5 may be mounted on the circuit board 60. Moreover, in the configuration in which the multiple light emitting chips 5 are mounted on the circuit board 60, each of the light emitting chips 5 may include multiple semiconductor layers 15.

Since the aforementioned processes before dicing are collectively performed on a wafer, interconnection and packaging need not be carried out for individual light emitting chips 5, whereby manufacturing cost can be reduced significantly. That is, the light emitting chips 5 are already interconnected and packaged when they are cut out into the individual chips. In addition, examination can be carried out by wafers, leading to improvement in productivity and making it easier to manufacture the light emitting chips 5 at a lower cost.

Figure 12:
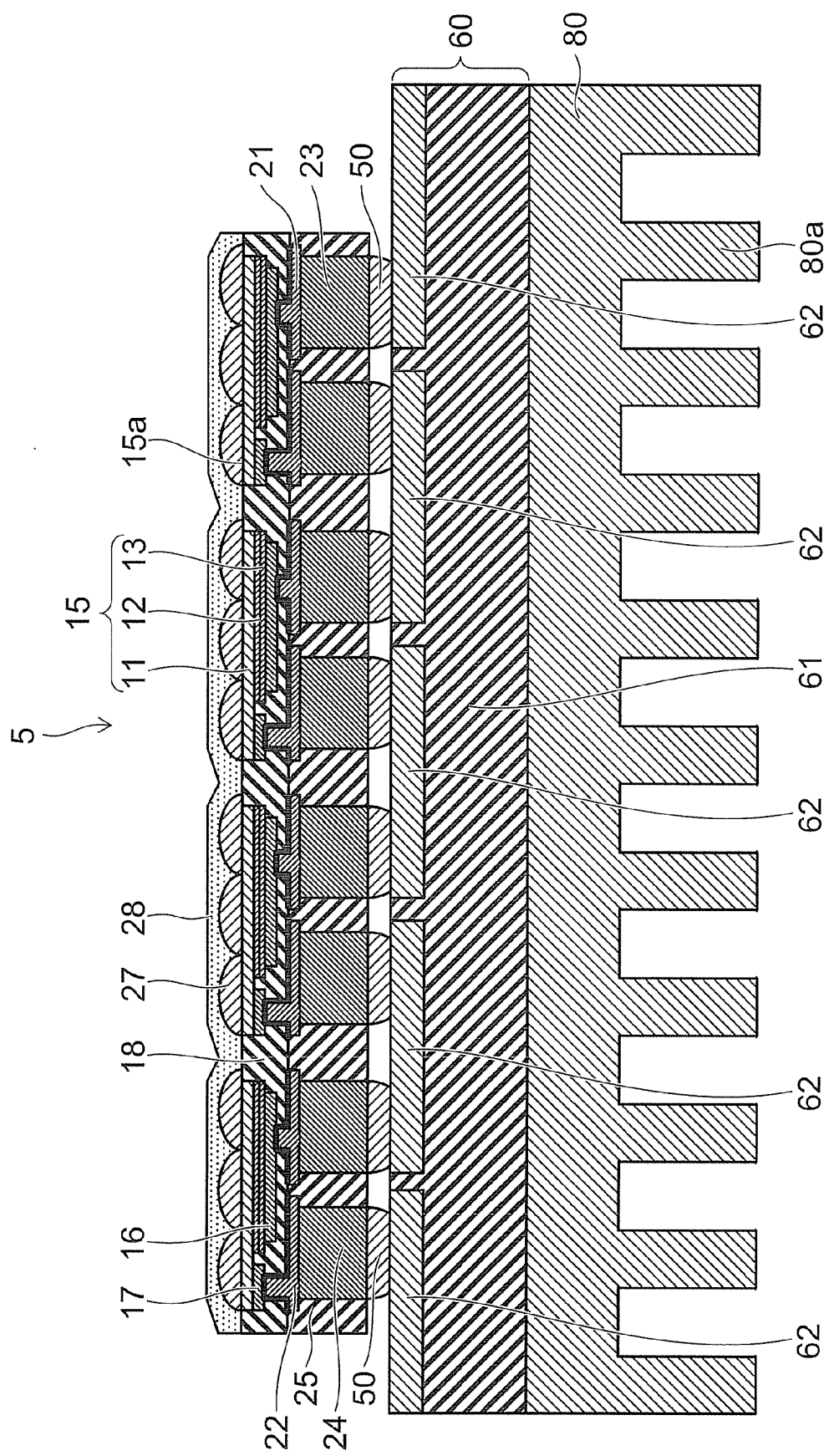
FIG. 12 is a schematic cross-sectional view showing still another specific example of the light emitting chip.

Alternatively, as shown in FIG. 12, the lenses 27 may be provided on the first main surface 15a, and the phosphor layer 28 may be provided on the first main surface 15a to cover the lenses 27. In addition, instead of the convex shape, the lens 27 may have a concave shape.

Second Embodiment

Figure 13:
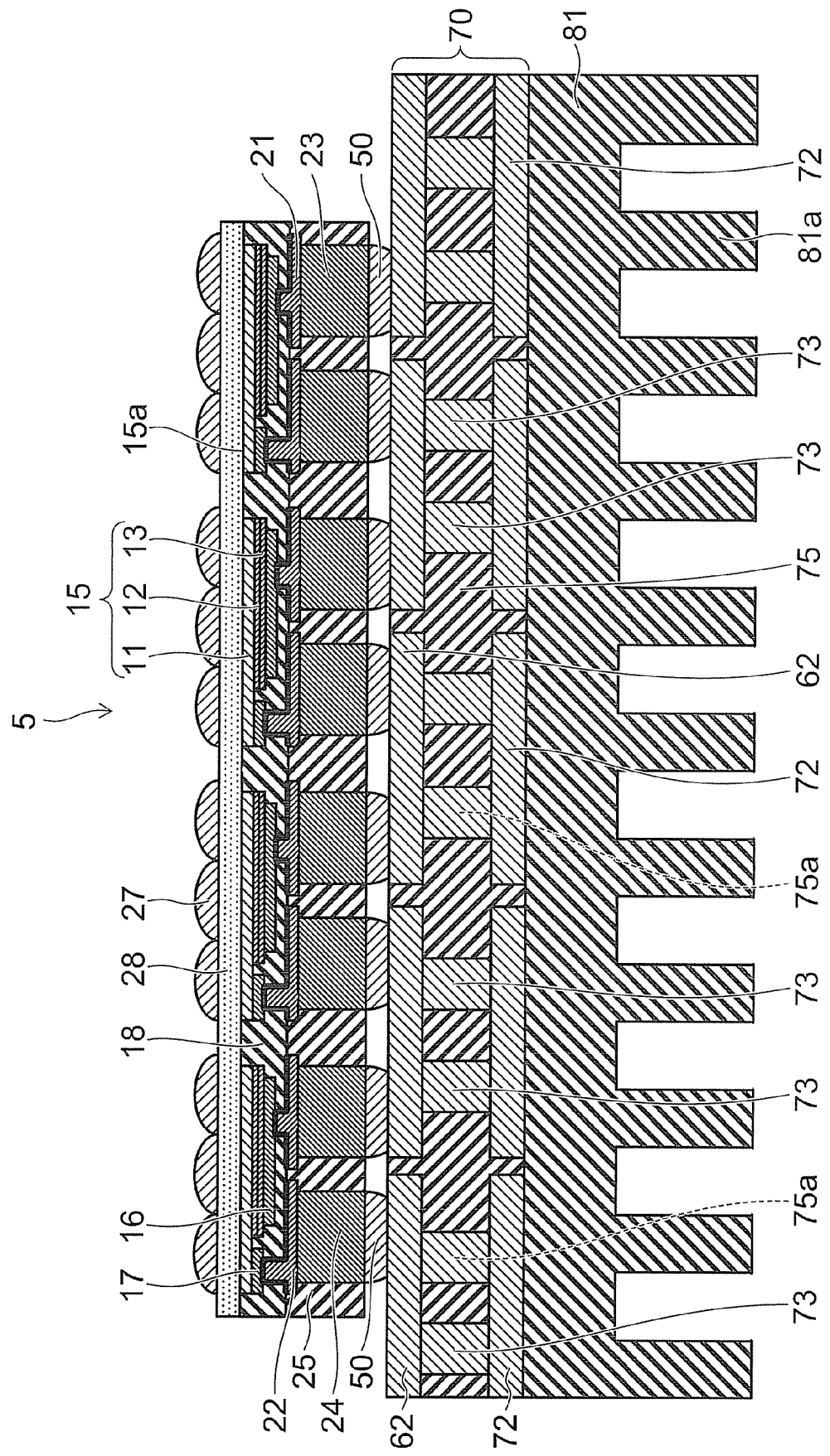
FIG. 13 is a schematic cross-sectional view of a light emitting device of a second embodiment.

FIG. 13 is a schematic cross-sectional view of a light emitting device of a second embodiment.

The light emitting device of this embodiment includes a light emitting chip 5, external terminals 50 and a circuit board 70 on which a light emitting chip 5 is mounted via the external terminals 50. The configuration and the production method of the light emitting chip 5 are the same as those of the first embodiment described above.

The circuit board 70 includes a interconnection 62 and an insulative resin substrate 75. The resin substrate 75 has, for example, a configuration in which glass fiber is impregnated with a resin material such as epoxy resin. The interconnection 62 is made of a metal material such as copper, and is laid out in a desired pattern on a surface of the resin substrate 75. The resin substrate 75 supports the interconnections 62 and serves as an insulator among the interconnections 62.

The circuit board 70 also includes a heat radiation material provided under the interconnections 62 in contact therewith. The heat radiation material is a metal material 73 filled in a thermal via (radiation through-hole) 75a formed on the resin substrate 75 under the interconnections 62. The dimension of the thermal via 75a in the depth direction thereof, that is, the thickness of the metal material 73 in the vertical direction is thicker than the thickness of the interconnection 62.

Multiple metal materials 73 are provided as heat radiation materials under a single interconnection 62, and adjacent metal materials 73 are insulated with the resin substrate 75. Alternatively, a metal material of a larger diameter may be used, the material being formed by bonding multiple metal materials 73.

A metal pattern 72 is formed on the back surface (the surface opposite to the surface on which the interconnection 62 is formed) of the resin substrate 75. The thermal via 75a reaches the metal pattern 72, and a bottom of the metal material 73 is connected to the metal pattern 72. Multiple metal patterns 72 are formed to correspond to the multiple interconnections 62. The corresponding interconnection 62 and metal pattern 72 are connected via the metal material 73. The multiple metal patterns 72 are separated from each other so that the multiple interconnections 62 are not short-circuited. The resin substrate 75 is provided to the parts where the metal patterns 72 are separated.

Bottom surfaces of a p-side metal pillar 23 and an n-side metal pillar 24 are bonded, via the external terminal 50, to the interconnection 62 formed on a surface of the circuit board 70.

As similar to the first embodiment, in the light emitting chip 5 of this embodiment, elements such as electrodes 16 and 17, interconnection layers 21 and 22, and metal pillars 23 and which are configured of metal having high thermal conductivity are formed at the positions closer to the mounting surface than the semiconductor layer 15 is. With this configuration, heat generated in the semiconductor layer 15 can be efficiently conducted downward toward the mounting surface side.

Further, the metal pillars 23 and 24 are bonded to the interconnections 62 made of a metal material via the external terminals 50 also made of a metal material, and the metal material 73 and the metal pattern 72 are provided under the interconnections 62. Accordingly, the light emitting device, as a whole, has high thermal conductivity toward the lower part of the device, radiation toward the lower part thereof is facilitated, and luminous efficiency is improved.

An area of the bottom surface of the metal pattern 72 is larger than areas at which the metal pattern 72 is in contact with the metal materials 73. In other words, the metal pattern 72 spreads on the back surface of the resin substrate 75 with an area larger than the metal materials 73. Hence, when incorporating the light emitting device into light equipment or the like, the radiation property is further enhanced by bonding the back surface of the resin substrate 75 to a radiator 81. Additionally, by providing a fin structure 81a in the radiator 81, a radiation area is enlarged to still further enhance the radiation property. In this case, the radiator 81 is an insulative radiator and thus short circuit does not occur among the multiple metal patterns 72. Accordingly, short circuit does not occur among the multiple interconnections 62, either. The radiator 81 is made of a ceramic having a high radiation property such as aluminum nitride. Otherwise, the radiator 81 may be formed by coating a metal surface with an insulating film.

Figure 14:
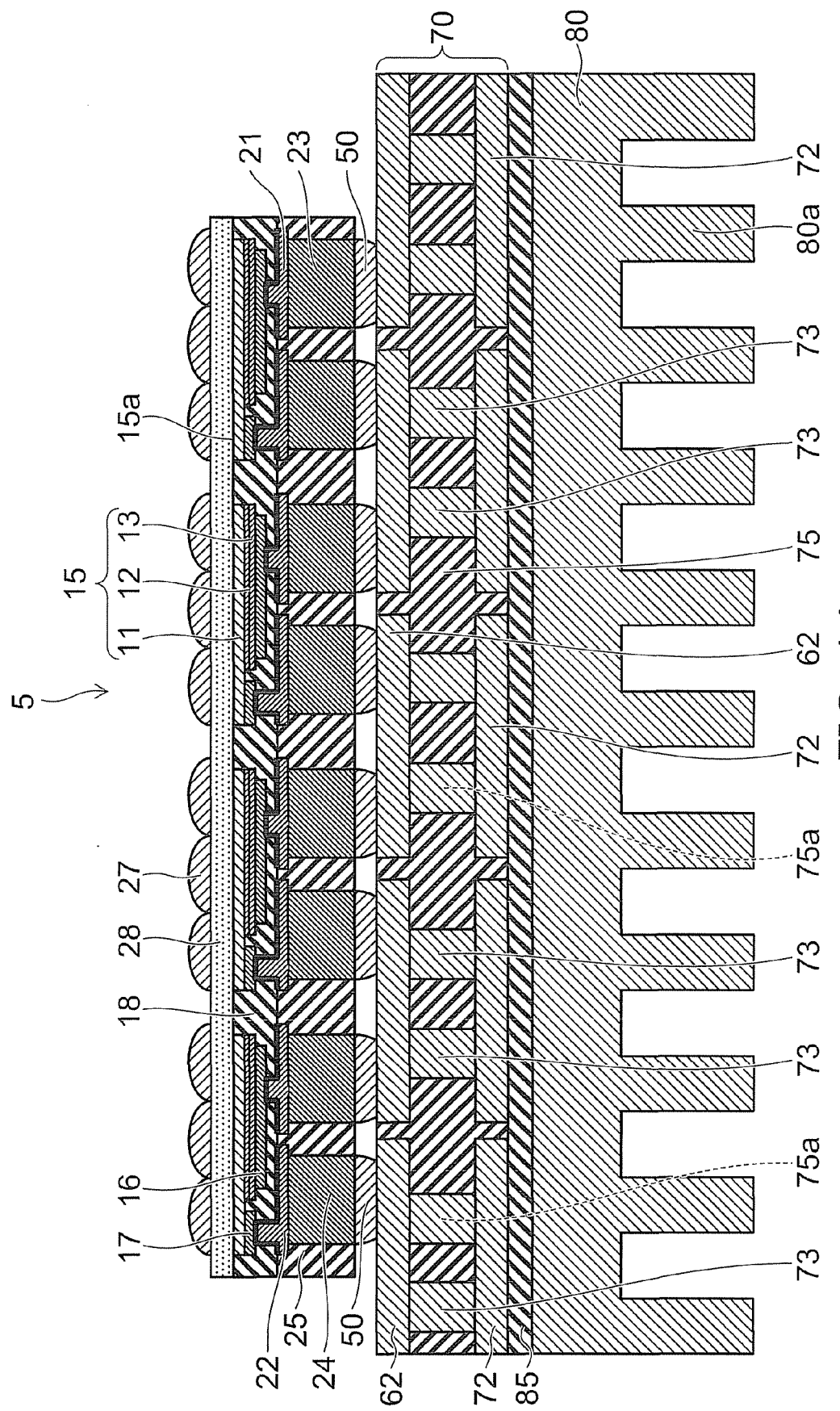
FIG. 14 is a schematic cross-sectional view showing still another specific example of the second embodiment.

Alternatively, by providing an insulator 85 under the metal pattern 72 as shown in FIG. 14, the back surface of the circuit board 70 may be contacted to a metal body 80. The insulator 85 has thermal conductivity, and is provided in the form of a paste, a film or a plate. The insulator 85 is a silicone resin containing ceramic powder, for example.

In the embodiments described above, instead of being removed entirely, the substrate 10 may be ground thinly and be left on the first main surface 15a. By leaving the substrate 10 in the form of a thin layer, mechanical strength can be made stronger than the configuration in which the substrate 10 is removed entirely, and thus a highly reliable configuration can be obtained. In addition, by leaving the substrate 10, warpage of the light emitting chip 5 after being cut out can be prevented, making it easier to mount the chip to a mount board or the like.

Although a part of the aforementioned metal body or the radiator is formed into a fin shape, this shape is not limited to a fin, and may be any shape as long as the structure enlarges the surface area. For example, the metal body or the radiator may be larger, or a large amount of wire may be additionally provided. Alternatively, the structure may be such that the metal body or the radiator is to be fitted to a larger component such as a wall of a house.

The red phosphor layer may contain a nitride based phosphor $CaAlSiN_3$:Eu or a SiAlON based phosphor, for example.

When using a SiAlON based phosphor, it may be preferable to use the following material.

    composition formula 1

(M is at least one metallic element except for Si or Al, and desirably at least one of Ca or Sr. R is a luminescent center element and Eu is desirable. x, a1, b1, c1 and d1 satisfy the following relationship: $0<x\leq1$, $0.6<a1<0.95$, $2<b1<3.9$, $0.25<c1<0.45$, $4<d1<5.7$).

By using the SiAlON based phosphor expressed by the composition formula 1, temperature property of wavelength conversion efficiency is improved, and efficiency in regions of high current density can be further improved.

The yellow phosphor layer may contain a silicate based phosphor $(Sr, Ca, Ba)_2SiO_4$:Eu, for example.

The green phosphor layer may contain a halophosphate phosphor $(Ba, Ca, Mg)_{10}(PO_4)_6.Cl_2$:Eu or a SiAlON based phosphor.

When using a SiAlON based phosphor, it may be preferable to use the following material.

    composition formula 2

(M is at least one metallic element except for Si or Al, and desirably at least one of Ca or Sr. R is a luminescent center element and Eu is desirable. x, a2, b2, c2 and d2 satisfy the following relationship: $0<x\leq1$, $0.93<a2<1.3$, $4.0<b2<5.8$, $0.6<c2<1$, $6<d2<11$).

By using the SiAlON based phosphor expressed by the composition formula 2, temperature property of wavelength conversion efficiency is improved, and efficiency in regions of high current density can be further improved.

The blue phosphor layer may contain an oxide based phosphor $BaMgAl_{10}O_{17}$:Eu, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A light emitting device comprising:
a light emitting chip;
an external terminal made of a metal material; and
a circuit board having the light emitting chip mounted via the external terminal,
the light emitting chip including:
a semiconductor layer having a first main surface, a second main surface formed on an opposite side of the first main surface, and a light emitting layer;
a first electrode provided on the second main surface in a region where the light emitting layer is provided;
a second electrode provided on the second main surface;
an insulating layer provided on the second main surface side of the semiconductor layer;
a first interconnection layer provided on a surface of the insulating layer opposite to a surface facing the semiconductor layer and provided in a first opening formed in the insulating layer to reach the first electrode, the first interconnection layer being connected to the first electrode;
a second interconnection layer provided on a surface of the insulating layer opposite to a surface facing the semiconductor layer and provided in a second opening formed to reach the second electrode, the second interconnection layer being connected to the second electrode;
a first metal pillar provided on a surface of the first interconnection layer opposite to a surface facing the first electrode;
a second metal pillar provided on the surface of the second interconnection layer opposite to the surface facing the second electrode; and
a resin layer provided between a side surface of the first metal pillar and a side surface of the second metal pillar, and
the circuit board including
an interconnection bonded to the first metal pillar and the second metal pillar via the external terminal, and
a heat radiation material provided on an opposite side of the interconnection and connected to the interconnection.

2. The device of claim 1, wherein the heat radiation material is thicker than the interconnection.

3. The device of claim 1, wherein the heat radiation material is an insulative ceramic substrate.

4. The device of claim 3, wherein a surface of the ceramic substrate opposite to a surface on which the interconnection is formed, is contacted with a metal body.

5. The device of claim 4, wherein the metal body includes a fin structure.

6. The device of claim 1, wherein
the circuit board further includes a resin substrate supporting the interconnection, and
the heat radiation material is a metal material provided inside a thermal via formed in the resin substrate on an opposite side of the interconnection.

7. The device of claim 6, wherein
the circuit board further includes a metal pattern formed on a surface of the resin substrate opposite to a surface on which the interconnection is formed, and
the thermal via reaches the metal pattern, and a bottom edge of the metal material is connected to the metal pattern.

8. The device of claim 7, wherein an area of a surface of the metal pattern opposite to a surface facing the metal material is larger than an area at which the metal pattern connects with the metal material.

9. The device of claim 7, wherein a surface of the metal pattern opposite to the interconnection is contacted to an insulative radiator.

10. The device of claim 9, wherein the insulative radiator includes a fin structure.

11. The device of claim 7, wherein a surface of the metal pattern opposite to the interconnection is contacted to a metal body via an insulator having thermal conductivity.

12. The device of claim 11, wherein the metal body includes a fin structure.

13. The device of claim 1, wherein an area of the first electrode is larger than an area of the second electrode.

14. The device of claim 1, wherein a contact area between the second interconnection layer and the second metal pillar is larger than a contact area between the second interconnection layer and the second electrode.

15. The device of claim 1, wherein a part of the second interconnection layer extends on the insulating layer to a position facing the light emitting layer.

16. The device of claim 1, wherein a thickness of the first metal pillar and the second metal pillar is thicker than a thickness of a stacked body including the semiconductor layer, the first electrode, the second electrode, the insulating layer, the first interconnection layer and the second interconnection layer.

* * * * *